US008604765B2

(12) United States Patent
Regier et al.

(10) Patent No.: US 8,604,765 B2
(45) Date of Patent: Dec. 10, 2013

(54) RESISTANCE SIMULATION AND COMMON MODE REJECTION FOR DIGITAL SOURCE-MEASURE UNITS

(75) Inventors: Christopher G. Regier, Cedar Park, TX (US); L. Rolando Ortega-Pohlenz, Austin, TX (US)

(73) Assignee: National Instruments Corporation, Austin, TX (US)

( * ) Notice: Subject to any disclaimer, the term of this patent is extended or adjusted under 35 U.S.C. 154(b) by 379 days.

(21) Appl. No.: 13/154,282

(22) Filed: Jun. 6, 2011

(65) Prior Publication Data

US 2012/0306460 A1 Dec. 6, 2012

(51) Int. Cl.
*G05F 1/00* (2006.01)
(52) U.S. Cl.
USPC ........... 323/283; 323/285; 323/293; 324/713; 341/142
(58) Field of Classification Search
USPC .......... 323/245, 275, 283, 285, 293; 324/713; 341/142, 144
See application file for complete search history.

(56) References Cited

U.S. PATENT DOCUMENTS

| | | | |
|---|---|---|---|
| 4,878,009 A * | 10/1989 | Esser et al. | 323/275 |
| 5,579,236 A | 11/1996 | Tamamura et al. | |
| 5,754,041 A | 5/1998 | Kaito et al. | |
| 5,970,074 A | 10/1999 | Ehiro | |
| 7,502,697 B2 | 3/2009 | Holmquist et al. | |
| 7,903,008 B2 | 3/2011 | Regier | |
| 8,427,126 B2 * | 4/2013 | Peng et al. | 323/283 |
| 2009/0015221 A1 | 1/2009 | Kodera | |
| 2010/0277003 A1 * | 11/2010 | Von Novak et al. | 307/104 |
| 2012/0126766 A1 * | 5/2012 | Chen | 323/283 |
| 2012/0306517 A1 * | 12/2012 | Regier et al. | 324/750.01 |
| 2012/0306518 A1 * | 12/2012 | Regier et al. | 324/750.01 |
| 2012/0306559 A1 * | 12/2012 | Regier et al. | 327/306 |

OTHER PUBLICATIONS

"NI PXIe-4154: Battery Simulator Optimized for Mobile Device Test," National Instruments Corporation, Oct. 11, 2010, 4 pages.

* cited by examiner

*Primary Examiner* — Adolf Berhane
*Assistant Examiner* — Lakaisha Jackson
(74) *Attorney, Agent, or Firm* — Myertons Hood Kivlin Kowert & Goetzel, P.C.; Jeffrey C. Hood (57) ABSTRACT

A source-measure unit (SMU) may be implemented with digital control loops. The output voltage and output current may be measured with dedicated ADCs (analog-to-digital converters), and the readings obtained by the ADCs may be compared to a setpoint in a digital loop controller, which may produce an output to drive a DAC (digital-to-analog converter) to maintain the output voltage and/or output current at a desired setpoint. The digital loop controller may also digitally implement simulated resistance with high resolution, accuracy, and range, using Thévenin and Norton power supply models. Simulated resistor values may range from 10Ω to 10Ω for output currents in the 100 mA range, with a sub-200μΩ resolution. The range may be expanded up to 100 kΩ for output currents in the 10 μA range. The Norton and Thévenin implementations may be combined, and a "pure resistance" mode may be created for simulating any desired resistance value. A variation of the general resistance-simulation technique may also be used to compensate for Common Mode Voltage effects in the current measurement path, providing tighter output and measurement specifications at a lower component cost.

24 Claims, 4 Drawing Sheets

RESISTANCE SIMULATION AND COMMON MODE REJECTION FOR DIGITAL SOURCE-MEASURE UNITS

BACKGROUND OF THE INVENTION

1. Field of the Invention

This invention relates generally to measurement and data acquisition systems and, more particularly, to the design of digital source-measure units.

2. Description of the Related Art

Scientists and engineers often use measurement systems to perform a variety of functions, including measurement of a physical phenomena, a unit under test (UUT), or device under test (DUT), test and analysis of physical phenomena, process monitoring and control, control of mechanical or electrical machinery, data logging, laboratory research, and analytical chemistry, to name a few examples.

A typical measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others. Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and received digital signals to implement one or more digital I/O applications. DAQ devices may also include a Source-Measure Unit (SMU), which may apply a voltage to a DUT and measure the resulting current, or may apply a current to the DUT and measure the resulting voltage. SMUs are typically configured to operate according to what is commonly referred to as "compliance limits", to limit the output current when sourcing voltage, and limit the output voltage when sourcing current. In other words, a compliance limit on the measured signal may determine the (maximum) value of the sourced signal. For example, when applying a source voltage to a DUT and measuring current, a given current value (e.g. 1 A) specified as the compliance limit would determine the (maximum) input (source) voltage that might be provided to the DUT. In most cases compliance limits may depend and/or may be determined based on the DUTs, e.g. the maximum (absolute) value of the current that may flow into the DUT, or the maximum (absolute) value of the voltage that may be applied across the terminals of the DUT.

In the case of most SMUs, the setpoint (the desired output voltage when sourcing and regulating voltage, or the desired current value when sourcing and regulating current) and the compliance limits are typically programmable. SMUs are available to cover a variety of signal levels, from the microvolt ($\mu$V) range to the kilovolt (kV) range, and from the femtoampere (fA) range to the ampere (A) range. Some SMUs can deliver or dissipate significant power, while other SMUs may be operated at low power. The accuracy of SMUs is typically less than the accuracy of high-quality calibrators and/or digital multi meters (DMMs).

For quite a while, SMUs were implemented with precision digital-to-analog converters (DACs) used for programming the setpoint and compliance limits into an analog control loop. The output voltage across the output terminals of the SMU, or the output current flowing into the output terminal of the SMU were typically set using the analog control loops by comparing the outputs to the levels set by the DACs. Each output voltage or output current could be controlled separately, with only one of the analog control loops closed at any given time. Voltage values representative of current and voltage measurements were provided to an analog-to-digital (ADC) element. In some SMUs, separate ADCs (instead of a single ADC) were used to read the analog output voltage or the analog output current. These SMUs were generally limited in flexibility and high in complexity, resulting from requirements to minimize glitches during range switching. In order for the SMU to operate accurately, a high level of accuracy was required for the DACs and ADCs configured in the SMU.

A more recent trend has been to implement SMUs with a control loop configured in the digital domain. The output voltage and output current in such a configuration is measured with dedicated ADCs. When sourcing current, the current readings obtained by the ADCs are compared to a Current Setpoint, and when sourcing voltage, the voltage readings are compared to a Voltage Setpoint, to regulate the current and voltage outputs, respectively. The setpoints can be set, for example, in an FPGA (field programmable gate array) or DSP (digital signal processing) chip. The FPGA or DSP chip can be used accordingly to produce an output to drive a DAC until the output voltage and/or output current reach the respective desired levels. The SMU can be configured to source one type of signal while measuring another type of signal. For example, the SMU can be configured to measure the voltage across the terminals of a device under test (DUT), when sourcing (and regulating) a current to the DUT, and similarly, the SMU can be configured to measure the current flowing into the DUT, when sourcing (and regulating) the voltage applied across the terminals of the DUT.

Figure 2:
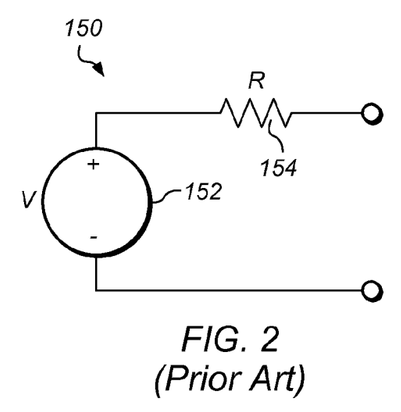
FIG. 2 shows the circuit diagram of a Thévenin equivalent circuit of a power supply according to prior art.
Figure 3:
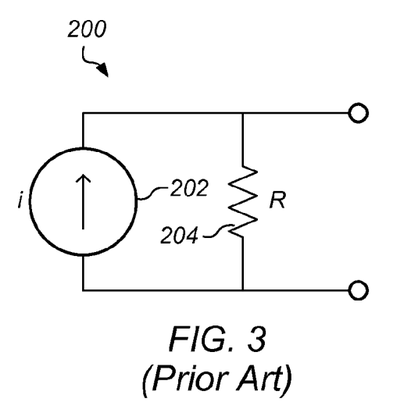
FIG. 3 shows the circuit diagram of a Norton equivalent circuit of a power supply according to prior art.

In addition to controlling voltage and/or current, SMUs are also used to control a combination or interaction of both, for example resistance or power. In particular, the simulation of resistance is useful in various applications. Positive resistance can be used to more accurately simulate the behavior of non-ideal power supplies, which are actually used to provide power to DUTs in real-life operation. Any power supply can be modeled as either a Thévenin or Norton equivalent. FIG. 2 shows the Thévenin equivalent circuit of a non-ideal power supply, modeled with an ideal voltage source 152 connected in series with a resistance 154 of value 'R'. FIG. 3 shows the Norton equivalent circuit of a non-ideal power supply, modeled with an ideal current source 202 connected in parallel with a resistance 204 of value 'R'.

An ideal power supply will have a Thévenin equivalent resistance of 0Ω, that is, the value of resistor 154 for an ideal power supply is considered 0Ω. Similarly, an ideal power supply will have an infinite Norton equivalent resistance, that is, the value of resistor 204 for an ideal power supply is considered to be infinite. At low frequencies, SMUs in general attempt to simulate an ideal source as long as they are within their compliance limits. This means that pulling more current when regulating for voltage will not reduce the voltage seen by the DUT. However, it is not always desirable to simulate an ideal power supply, as real-life power supplies are not ideal. Batteries in particular can have fairly high output impedances. Thus, it is desirable to have the capability to programmatically configure the value of R seen by a DUT for either of the equivalent circuits.

Alternatively, as seen in FIG. 2, if the value of the voltage provided by voltage source 152 were 0V (representative of a closed circuit), or, as seen in FIG. 3, if the value of the current provided by current source 202 were 0 A (representative of an open circuit), then the DUT would see a "pure" DC resistance. The simulation of resistance is useful in various applications, most notably when simulating sensors that have a varying resistance with respect to some physical characteristic (such as resistance thermometers or photoresistors). Thus, a system that accurately and programmatically simulates a given resistance can be used, for instance, to test devices that interact with these sensors.

Figure 4:
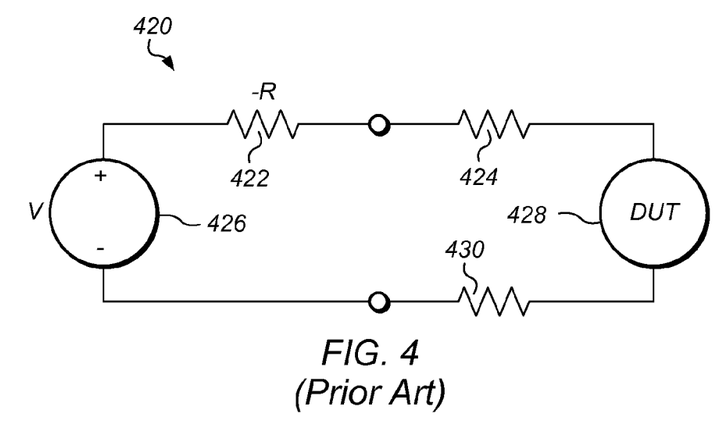
FIG. 4 shows a device under test coupled to a Thévenin equivalent circuit of a power supply, modeling resistance of the cables connecting the device under test, according to prior art.

Negative Resistance, though conceptually strange, can also be useful to simulate. Negative resistance can be used to compensate for resistive effects existing in the system. Thévenin negative resistance can be used to negate the resistive effects of cabling or of the DUT load board, in cases where it is impractical to use remote sensing (4-wire) and the test system is sufficiently characterized. Norton negative resistance can be used to negate leakage effects in the test system, in cases where it is impractical to use guarding and special cabling and the system is sufficiently characterized. As an example, FIG. 4 shows a Thévenin equivalent supply 426 with a resistance 422, with a DUT 428 coupled to the terminals of the supply. In this instance, resistances 424 and 430 represent the resistance of the cables/wires coupling DUT 428 to the ideal voltage source 426. Thus, simulating resistance 422 as a negative resistance (−R) having an absolute value commensurate with the total resistance presented by cable resistances 424 and 430 is useful to eliminate the non-ideality of the test fixture represented by those cable resistances.

Present day SMUs feature some resistance simulation, most commonly of the Thévenin variety. In particular, one of National Instruments' own products, the NI PXIe-4154 can configure its output resistance from −0.04Ω to 1Ω, with close to 10-bit resolution (~1 mΩ). Battery simulators available from various companies have similar ranges and resolutions, though implemented entirely in the analog domain. Currently, "pure" resistance simulation is typically implemented as "Active" resistance simulation. There are presently no combinations of a Norton and Thévenin resistance, with a cut-off point. Some systems, for example, use a PID (Proportional Integral Derivative) controller to directly control the resistance (the setpoint is R, which is compared with V/I).

Other corresponding issues related to the prior art will become apparent to one skilled in the art after comparing such prior art with the present invention as described herein.

SUMMARY OF THE INVENTION

In one set of embodiments, the SMU may be configured to check the measured entity (current or voltage) against specified compliance limits, which may effectively limit the magnitude of the sourced signal. The SMU may be configured to vary (lower) the regulated current or voltage from its respective setpoint, when the measured voltage or current, respectively, exceeds the value specified by the compliance limit. For example, if the setpoint for sourcing and regulating current is 1 A, and the voltage compliance limit is 5V, if sourcing a 1 A current in the DUT results in a measured voltage that exceeds 5V, the SMU may lower the current to below 1 A until the measured voltage no longer exceeds the allowed 5V. Similarly, if the setpoint for sourcing and regulating voltage is 5V, and the current compliance limit is 1 A, if sourcing a 5V voltage across the terminals of the DUT results in a measured current that exceeds 1 A, the SMU may lower the voltage to below 5V until the measured current no longer exceeds the allowed 1 A.

The readback values (for the measured current and/or voltage) may be obtained by averaging the current and/or voltage values received from the ADCs. The averaging may be weighted to provide noise rejection advantages. Placing the control loop in the digital domain may result in added flexibility of the SMU, and a decrease in the accuracy requirements on the DAC. The digital control loop may also offer the possibility of novel approaches for solving potential range-switching issues that may arise within the SMUs.

In one set of embodiments, an SMU may comprise output terminals configured to couple the SMU to a DUT, and further configured to convey an analog output signal to the DUT to effect an output current flowing into the DUT and an output voltage in the DUT. The SMU may include a first converter configured to generate a first digital value representative of the output current, a second converter configured to generate a second digital value representative of the output voltage, and a digital loop controller configured to receive the first digital value and the second digital value, and generate a digital control signal based on the first digital value and the second digital value to regulate a specified function of the output current and the output voltage to remain at a value corresponding to a setpoint. The specified function may be the output current, the output voltage, power, or resistance, to name a few. The first digital value, being representative of the output current, may correspond to a current measurement, and the second digital value being representative of the output voltage may correspond to a voltage measurement. The first digital value and second digital value may therefore effectively be used in measuring and/or controlling any function, which may be defined and/or processed in the digital loop controller. For example, multiplying the first digital value and the second digital value may provide a measurement of power. Accordingly, the digital control value may be generated by the digital loop controller to effect desired changes in the output current and/or the output voltage depending on what the selected function is. For example, if the selected function is power, then both the output current and output voltage may be regulated, or only one of the output current and output voltage may be regulated based on the measured output current and output voltage.

Overall, embodiments of an SMU comprising a digital loop controller may offer a number of advantages. For example, DAC errors may be corrected by the digital loop, reducing the accuracy requirements on the DAC. The control algorithm may be as simple or as complex as desired, and may be configured ranging from a simple integrator to a nonlinear adaptive system, thereby offering the potential to enhance stability and speed. It may also be possible to generate functions beyond the standard current-limited voltage source and voltage-limited current source. For example, it may be possible to generate constant power or constant resistance functions. In addition, voltage range switching may be performed transparently, and current range switching, potentially requiring shunt switching, may be performed more accurately.

In one set of embodiments, digital SMUs may be designed with a digital implementation of simulated resistance having high resolution, accuracy, and range. Some embodiments may simulate resistor values within a full −10Ω to 10Ω range for output currents in the 100 mA range, with a sub-200µΩ resolution (i.e. a resolution of under 200µΩ). The range may be expanded (possibly accompanied by a reduction in resolution) up to 100 kΩ for output currents in the 10 µA range. This may be applicable for Thévenin implementations, as well as Norton implementations. Furthermore, by combining the Norton and Thévenin implementations, a "pure resistance" mode may be created and used to simulate any desired resistance value. Finally, a variation of the general resistance-simulation technique may be deployed to compensate for Common Mode Voltage effects in the current measurement path, providing tighter output and measurement specifications at a lower component cost.

BRIEF DESCRIPTION OF THE DRAWINGS

The foregoing, as well as other objects, features, and advantages of this invention may be more completely understood by reference to the following detailed description when read together with the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Figure 1:
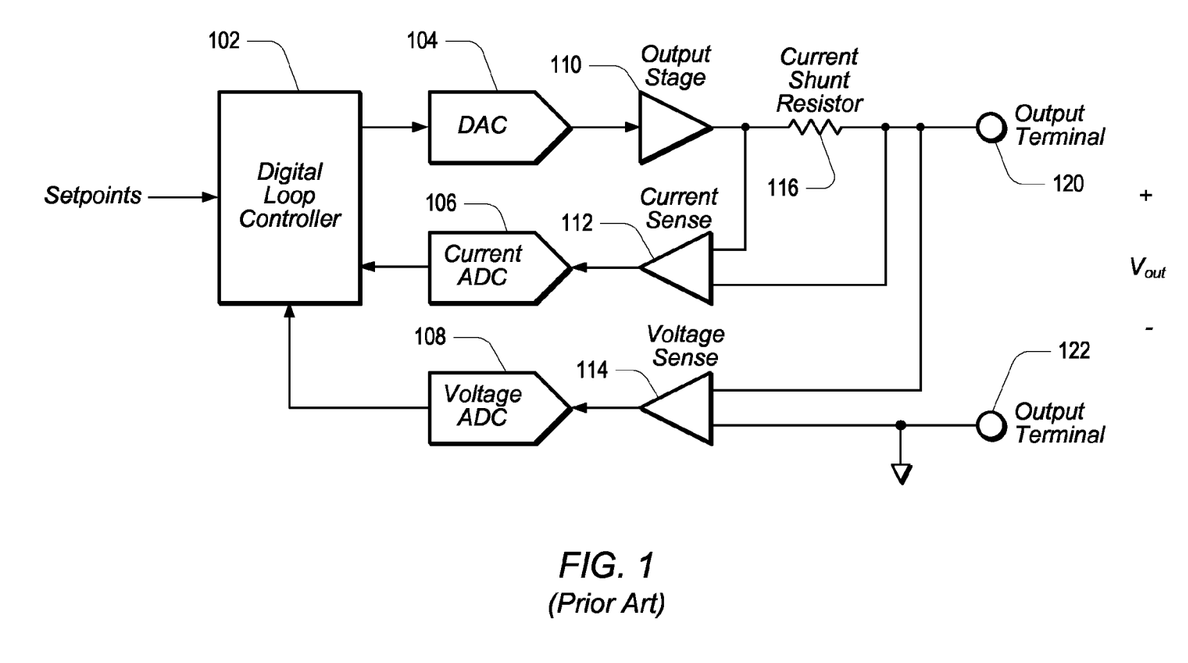
FIG. 1 shows the basic architecture of a prior art SMU featuring a digital control loop.

FIG. 1 shows the basic architecture of one embodiment of a prior art SMU (source-measure unit) in which the entire control loop has been configured in the digital domain. A DUT (device under test), not shown, may be coupled between output terminals 120 and 122. Setpoints and compliance limits may be provided (programmed) to Digital Loop Controller (DCL) 102, which may provide a control output through DAC (digital-to-analog converter) 104 to Output Stage 110. Feedback from Output Stage 110 may be provided to Current ADC (analog-to-digital converter) 106 and Voltage ADC 108 via respective Current Sense element 112 and Voltage Sense element 114. The current feedback may be taken from the current flowing through current shunt resistor 116, and the feedback voltage may be taken from across output terminals 120 and 122. Current ADC 106 and Voltage ADC 108 may then provide the readback current and voltage values into DCL 102.

DCL 102 may be configured to check the measured current (from Current ADC 106) resulting from a sourced voltage, against the specified current compliance limit provided (or programmed) into DCL 102. DCL 102 may similarly be configured to check the measured voltage (from Voltage ADC 108) resulting from a sourced current, against the specified voltage compliance limit provided (or programmed) into DCL 102. To regulate the output, DCL 102 may be configured to check the measured current (from Current ADC 106) resulting from a sourced current, against the specified current setpoint provided (or programmed) into DCL 102. DCL 102 may similarly be configured to check the measured voltage (from Voltage ADC 108) resulting from a sourced voltage, against the specified voltage setpoint provided (or programmed) into DCL 102.

The compliance limits may effectively limit the magnitude of the sourced signals. DCL 102 may be configured to vary (lower) the regulated current or voltage from its respective setpoint, when the measured voltage or current, respectively, exceeds the value specified by the compliance limit. For example, if the setpoint for sourcing and regulating current is 1 A, and the voltage compliance limit corresponding to a given DUT is 5V, when sourcing a 1 A current in the DUT results in a voltage measurement that exceeds 5V, DCL 102 may operate to lower the value of the sourced current below 1 A, until a sourced current value is reached for which the measured voltage no longer exceeds the allowed 5V. Similarly, if the setpoint for sourcing and regulating voltage is 5V, and the current compliance limit corresponding to a given DUT is 1 A, when sourcing a 5V voltage across the terminals of the DUT results in a current measurement that exceeds 1 A, DCL 102 may operate to lower the value of the sourced voltage below 5V, until a sourced voltage value is reached for which the measured current no longer exceeds the allowed 1 A.

The Digital Loop Controller (e.g. DCL 102) may provide the added flexibility of being able to operate the SMU for different compliance limits, (and being able to program multiple setpoints), without additional components. In addition, the loop bandwidth may easily be adjusted by changing the controller coefficients, and control loop adjustments may be made through measurable and controllable settling times of the signal. The DCL may also be reconfigurable to the desired mode, controlling/generating current, voltage, power, resistance, or voltage with series impedance, which may be valuable in battery simulation applications.

In one set of embodiments, DCL 102 may be implemented with an ASIC, a DSP, an FPGA, or any other suitable digital circuitry configured to perform the designated functions of DCL 102. An FPGA may be preferable for implementations utilizing National Instruments' LabVIEW graphical programming interface to write and simulate the control code. When using an FPGA with LabVIEW, the control code may be deployed and tested through LV-FPGA (LabVIEW FPGA). The control system itself may be designed to emulate a traditional SMU, while allowing users to implement more advanced features by writing their own control algorithm (for example in LV-FPGA when using LabVIEW and an FPGA). Some embodiments may also implement more advanced features such as constant power delivery or sinking, or constant resistance generation. For safety considerations, especially in user-configured situations, the output of DAC 304 may be limited to a safe level, regardless of feedback.

It should also be noted that when trying to regulate power, for example, two ADCs may be required for obtaining the requisite measurements for the power regulation to be performed. One ADC may be required to measure current (e.g. ADC 106) and another ADC may be required to measure voltage (e.g. ADC 108), with the multiplication (to obtain the power value that may be compared to a setpoint) performed digitally, in DCL 102, for example. Thus, certain embodiments, where the sourced and measured entity is the same (e.g. sourcing current and measuring current), may be configured with a single ADC. In one set of embodiments, when only always one entity (e.g. Current or Voltage) is to be measured, one of the ADCs may simply be removed. In another set of embodiments, the output from the Current Sense element and the output of the Voltage Sense element may be input to a multiplexer (not shown in any of the figures), which may be used to select whether sensed voltage or sensed current is to be converted to the digital value provided to the Digital Loop Controller. These embodiments may be useful, for example, in certain applications where compliance limits were unnecessary, and/or the primary functionality was regulation of the output.

Thévenin Resistance Simulation

Figure 6:
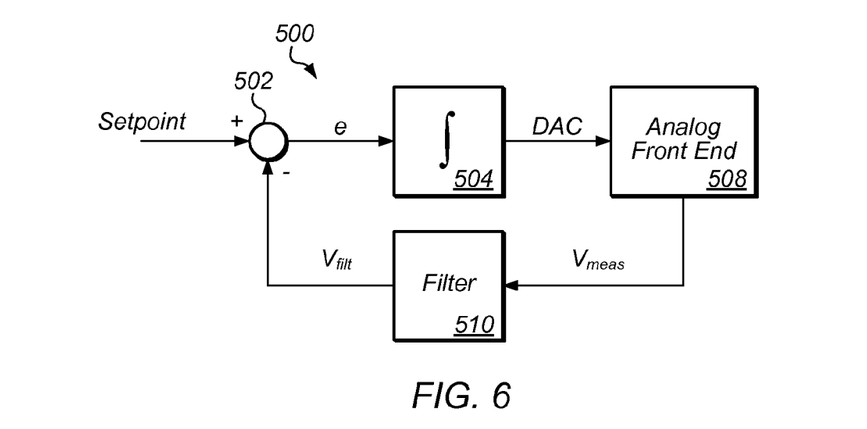
FIG. 6 shows a simplified block diagram of one embodiment of a voltage control loop in a digital SMU.

A greatly simplified block diagram of one embodiment of a control loop in a digital SMU is shown in FIG. 6. For purposes of illustration, control loop 500 may be considered a voltage control loop (i.e. regulating for output voltage), with a specified Setpoint provided to node 502. In other embodiments, the control loop may represent a current control loop, with the measured feedback value representing current. In FIG. 6, The Setpoint may be compared with the actual measured voltage $V_{meas}$ (or a filtered version $V_{filt}$ obtained from Filter 510) to determine the error value that is to be provided to an integrator 504. The integrator 504 may generate a new DAC value, which may be provided to the analog front end 508. On the next iteration, a new voltage measurement may be fed back to filter 510.

A resistor may be effectively simulated by actually simulating the effect that the resistor has in the given system. Specifically, a resistor may cause a voltage drop that's proportional to the current flowing through it. The Setpoint may be adjusted to reduce the desired output voltage by the voltage drop amount corresponding to a voltage that may be developed across the simulated resistor. The adjustment of the Setpoint may be performed automatically and instantaneously, since this voltage drop may vary according to the instantaneous current being output. In one set of embodiments, the adjustment may therefore be implemented in hardware. In another set of embodiments, as will also be further described below, the feedback value to node 502 may be adjusted instead of the setpoint, to achieve a similar effect, the feedback value (either into node 502 or filter 510) taking into account the voltage drop amount corresponding to the voltage that may be developed across the simulated (or virtual) resistor.

Figure 7:
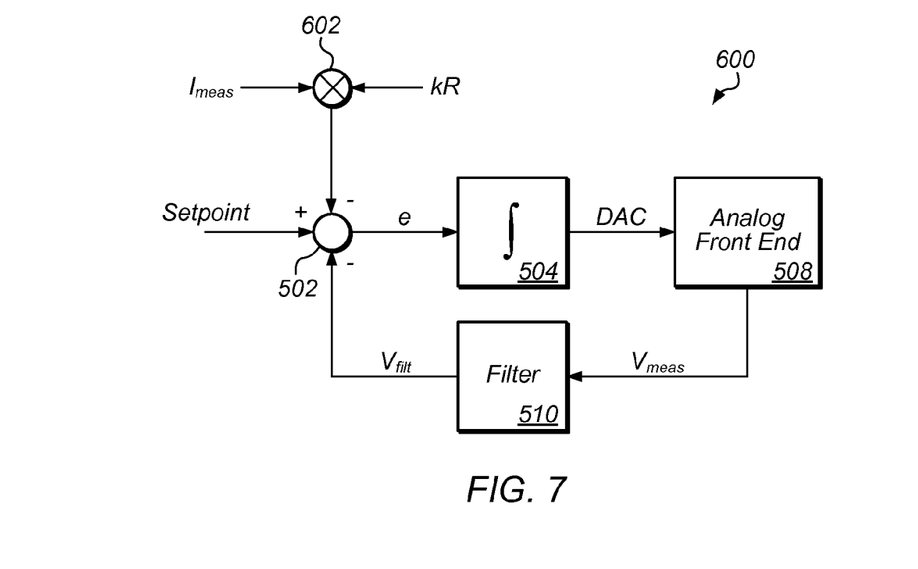
FIG. 7 shows one possible embodiment of resistor simulation implemented in a voltage control loop in a digital SMU.
Figure 8:
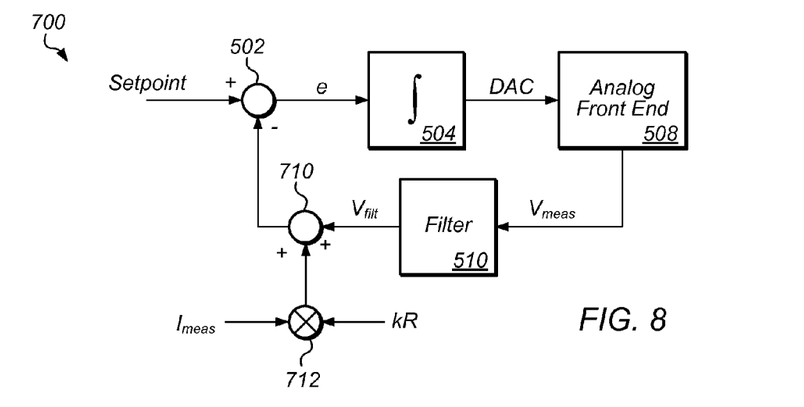
FIG. 8 shows another possible embodiment of resistor simulation implemented in a voltage control loop in a digital SMU.

As mentioned above, several equivalent implementations of the above-described method are possible and are contemplated. One possible implementation 600 follows the description provided above, as shown in FIG. 7. The current measurement "$I_{meas}$" may be multiplied at node 602 by a constant "kR" that is proportional to the desired resistance, and adjusted by both the voltage and current ADC gains. This may result in a value that corresponds to an instantaneous voltage drop, which may then be subtracted from the setpoint as shown in FIG. 8. The net effect is the simulation of a Thévenin resistance proportional to kR. Extra resolution bits may be used after the multiplication 602, and the controller integrator 504 may be used as a filter to obtain DC resolution on the desired resistance.

It should be noted that for a kR value that is not equal to 0, any offset in $I_{meas}$ may be present as a spurious voltage offset $V_{offsetR}$, where $V_{offsetR}=kR*I_{offset}$. This may be a constant value, and may not depend on the magnitude of the measured current. Since the value of the current offset may be known (from calibration), this error may be corrected. One way to correct this error is to adjust the setpoint by $-V_{offsetR}$, which may be performed, for example, by the software configuring the system. Another way may be to subtract the (known) offset from $I_{meas}$ in hardware. In some embodiments, a software implementation may be preferred if it reduces hardware complexity and results in greater accuracy.

A mathematically equivalent implementation 700 is shown in FIG. 8. In this case, instead of effectively modifying the setpoint, the feedback value into node 502 may be modified. As shown in FIG. 8, the measured voltage may be increased by a voltage amount $I_{meas}*kR$ corresponding to the desired simulated voltage drop. The simulated voltage drop may be obtained at node 712 by multiplying the measured current with the constant proportional to the simulated resistance, and the voltage is then added at node 710 to the feedback voltage output from filter 510. The resulting compound voltage value is then subtracted from the Setpoint to obtain the error value. The voltage drop may also be situated in front of filter 510, so that the simulated voltage drop is exposed to the same response as the rest of the voltage loop. This implementation is shown in FIG. 9.

Figure 9:
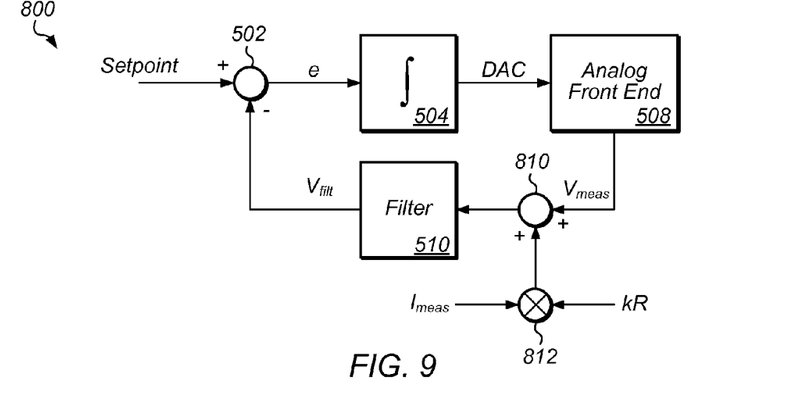
FIG. 9 shows yet another possible embodiment of resistor simulation implemented in a voltage control loop in a digital SMU.

As shown in FIG. 9, the simulated voltage drop may be obtained at node 812 by multiplying the measured current with the constant proportional to the simulated resistance, and the voltage is then added at node 810 to the feedback voltage from analog front end 508. The resulting compound voltage value is then provided to filter 510, resulting in the simulated voltage drop getting the same response as the rest of the voltage loop. It should be noted that as the value of the resistance increases, small changes in current may cause substantial changes in the simulated voltage drop, which may affect the control loop. In particular, it may couple noise from the current measurement into the voltage output, but more importantly, it may eventually lead to instability in the voltage loop. Therefore, it may be desirable to limit the value of the simulated resistance.

Norton Resistance Simulation

Simulating a Norton Resistance is useful in simulating a non-ideal current source. As previously mentioned, negative Norton Resistance may be used to compensate for leakage effects in a system. However, it is much less common to create a programmable non-ideal current source than to create a programmable non-ideal voltage source. It may be particularly worthwhile to implement a programmable non-ideal current source however, for the purpose of simulating a "pure resistance". In this case, by using a Norton simulation, the range of resistance values may be extended beyond the limitations imposed by a Thévenin simulation.

Figure 10:
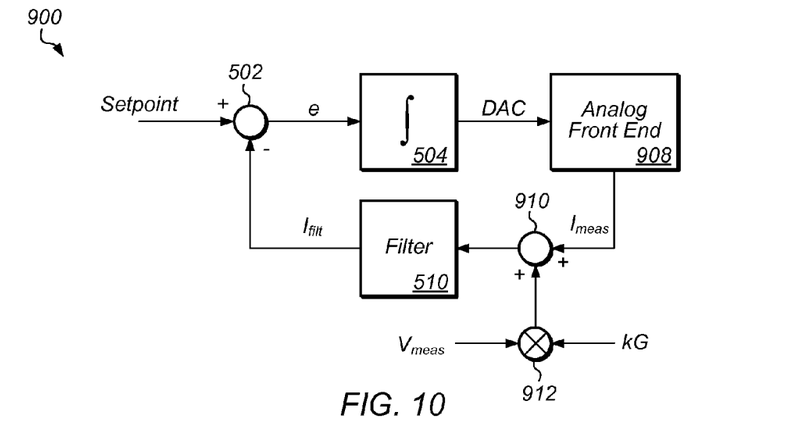
FIG. 10 shows one possible embodiment of resistor simulation implemented in a current control loop in a digital SMU.

As previously mentioned, the control loop present in FIG. 6 may be reconfigured as a current control loop. Accordingly, an implementation analogous to those described above, but applied to a current loop instead of a voltage loop may be designed, as shown in FIG. 10. In this case, the analog front end 908 provides feedback information representative of the measured current $I_{meas}$, whereas, for example, in FIGS. 7-10, the feedback information was representative of the measured voltage, and the measured current was used in obtaining the voltage drop associated with the simulated resistance. Accordingly, the Setpoint provided to node 502 is a current setpoint. The difference in the implementation shown in FIG. 10 is that kG actually represents the conductance 1/R (instead of resistance R), also adjusted according to the relative Voltage and Current gains. Thus, a value corresponding to a current "conducted" by the simulated parallel resistance in the Norton equivalent circuit may be obtained by multiplying the measured voltage $V_{meas}$ with kG at node 912, summing the result with the measured current $I_{meas}$ at node 910. The resulting compound current is then provided to filter 510 in the feedback path.

For a given, or respective voltage, a smaller resistance means a higher conductance and hence more "current loss" (refer to FIG. 3, for the Norton model of a power source), where less current gets provided to the DUT, as more current flows in the simulated resistance. Also, for a given resistance, a greater voltage means more current loss, and thus the effect of a resistance in parallel with the current source has been simulated. It should be noted that, contrary to the Thévenin case, the magnitude of the current loss is inversely proportional to the resistance value. Bigger resistances mean smaller effects, and a more stable loop. It is therefore still possible to simulate zero conductance, which is equivalent to having no resistance in parallel with the current source, representing an ideal current source. A similar situation exists in the Thévenin case as well, where zero Resistance may be simulated to represent an ideal voltage source.

Combined Norton/Thévenin Resistance Simulation

A "pure" resistor may therefore be simulated by using either a Norton or Thévenin equivalent and setting the Current or Voltage sources to 0, respectively. Since the Thévenin resistance simulation is more stable and less prone to noise for resistance values close to zero, and the Norton resistance is preferable for larger values of the resistance (i.e. conductance values close to zero), a combination of Norton/Thévenin resistance maximizes each implementation's advantages. In one set of embodiments, a Thévenin circuit equivalent may be used for lower resistance values, and the system may seamlessly change over to a Norton circuit equivalent for resistance values above a specified threshold. In other words, for a specified range of desired simulated resistance values (e.g. 0Ω to 10Ω), a voltage control loop (e.g. such as those shown in FIGS. 8-10) may be used to adjust the voltage setpoint according to the desired simulated resistance, whereas desired simulated resistance values that are above 10Ω, the SMU may seamlessly switch over to a current control loop (e.g. such as the one shown in FIG. 11), which may be used to adjust the current setpoint according to the desired simulated resistance.

Common Mode Correction

Application of a general resistance simulation approach may improve the Common Mode Rejection (CMM) of the measurement path. A simplified view of one embodiment of a digital SMU is shown in FIG. 1. As seen in FIG. 1, the differential amplifier 112 measures the voltage drop across the Shunt Resistor 116. One of the inputs of differential amplifier 112, however, is connected to the Output Terminal 120. Therefore, the output voltage is now received as common mode voltage by differential amplifier 112, which provides the input to current ADC 106. The output of differential amplifier 112 may have an offset that is approximately proportional to the voltage at the output, and which may be detected by the user as a measurement error. Since this measurement may also be used by the DLC 102 to control current or a magnitude derived from current, this error may also manifest itself as an output error. However, due to the architecture of the SMU shown in FIG. 1, voltage and current measurements may be accessed simultaneously, which allows for the characterization of this Common Mode effect, also allowing for a compensation for the Common Mode effect.

Figure 5:
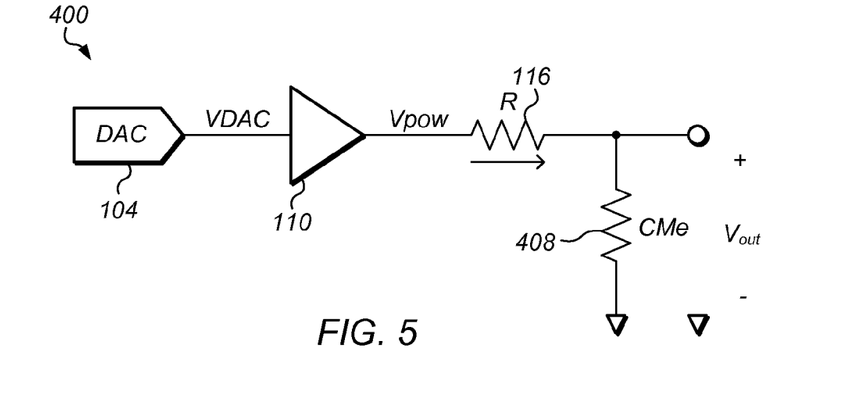
FIG. 5 shows the output stage of a digital SMU, including a modeled Common Mode effect "resistor" coupled to the output terminal.

The effect is analogous to a resistor configured in parallel with the output, as shown in FIG. 5. The current through the Common Mode effect "resistor" 408 is proportional to the voltage at the output, so the current delivered to the output is offset by this "leakage". This effect may be eliminated by simulating a Norton equivalent resistance, as shown before, that is similar in magnitude but opposite in sign to the value of the conceptual Common Mode effect resistor 408. To this end, the magnitude of the Common Mode effect resistor 408 may be identified prior to performing the simulations. An internal switch may be used to short together the inputs to the differential amplifier 112, effectively providing IADC 106 with a 0 current value. A series of voltages may then be sourced to $V_{out}$. Two points may be generally sufficient. For each of these points, the output voltage and the produced (effected) current may be simultaneously measured. From these measurements, the slope of the error introduced by the CMe (the value of the virtual CMe resistor) and the offset for the current ADC, which is useful for general calibration, may be calculated. Once the value of the CMe slope has been calculated, a hardware construct equivalent to the aforementioned simulation of Norton Equivalent Resistance may be used to greatly reduce its effect. The (instantaneous) voltage reading may be multiplied by the measured CMe slope, and the resulting value may be subtracted from the current measurement. Equivalently, multiplication by the negated slope may also be performed, and the corresponding "anti-offset" result may be added to the measurement. The value of CMe 408 may be small enough to have extra resolution added to the IADC reading.

Besides being used by the Digital Loop Controller, the corrected value may also be made available to the user. Real elimination of the effect and of the (minimal) noise coupled into the current measurement from voltage ADC 108 may require some filtering. On the output side, the integrating action of the controller may guarantee accuracy at DC. On the measurement side, measurement filtering may be sufficient. An analogous correction may be applied in situations where the output current affects the common-mode voltage seen by the voltage measurement path, for example if the current-measuring shunts were in series with the LO (ground) lead rather than the HI (Vout) lead.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A source-measure unit (SMU) comprising:
    output terminals configured to couple to corresponding input terminals of a device, and provide an output voltage across the input terminals of the device to effect an output current flowing in the device;
    a digital loop controller configured to:
        receive a first digital value representative of the output current, and a second digital value representative of the output voltage;
        regulate a function of the output voltage and the output current according to the first digital value, the second digital value, and a parameter that is proportional to a specified resistance value simulating effects of a resistance not physically present on a control path between an output of the digital loop controller and the output terminals of the SMU.

2. The SMU of claim 1, wherein the specified resistance value corresponds to a resistance characteristic of a non-ideal power source used to power the device when the device is not coupled to the SMU.

3. The SMU of claim 1, wherein to regulate the function of the output voltage and the output current, the digital loop controller is configured to:
    adjust the output voltage to maintain the output voltage at a specified setpoint; and
    adjust the specified setpoint according to a function of the first digital value and the parameter.

4. The SMU of claim 1, wherein to regulate the function of the output voltage and the output current, the digital loop controller is configured to:
    adjust the output voltage to maintain the output voltage at a specified setpoint; and
    adjust the second digital value according to a function of the first digital value and the parameter.

5. The SMU of claim 1, wherein to regulate the function of the output voltage and the output current, the digital loop controller is configured to:
    adjust the output voltage to maintain the output current at a specified setpoint; and
    adjust the specified setpoint according to a function of the second digital value and the parameter.

6. The SMU of claim 1, wherein to regulate the function of the output voltage and the output current, the digital loop controller is configured to:
    adjust the output voltage to maintain the output current at a specified setpoint; and
    adjust the first digital value according to a function of the second digital value and the parameter.

7. The SMU of claim 1, wherein to regulate the function of the output voltage and the output current, the digital loop controller is configured to:
    generate a digital control value based on the first digital value, the second digital value, and the parameter;
    generate an analog control signal from the digital control value; and
    adjust the output voltage according to the analog control signal.

8. The SMU of claim 1, wherein the specified function is one or more of:
    the output current;
    the output voltage;
    power; and
    resistance.

9. A digital loop controller comprising:
    input terminals configured to receive:
        a first digital value representative of an output current flowing in a device; and
        a second digital value representative of an output voltage developed across input terminals of the device, wherein the output current is effected by the output voltage;
    wherein the digital loop controller is configured to:
        regulate a function of the output voltage and the output current according to the first digital value and the second digital value to maintain one of the output voltage and the output current at a specified setpoint corresponding to a desired value; and
        adjust one or more of the setpoint, the first digital value, and the second digital value, to adjust the desired value by one of:
            an amount corresponding to a voltage that would be developed across a specified resistor if the specified resistor were coupled to an output of the digital loop controller; and
            an amount corresponding to a current that would be developed in the specified resistor if the specified resistor were coupled to an output of the digital loop controller.

10. The digital loop controller of claim 9, wherein to maintain one of the output voltage and the output current to remain at the specified setpoint, the digital loop controller is configured to regulate the function of the output voltage and the output current according to the first digital value, the second digital value, and a parameter that is proportional to a value of the specified resistor.

11. The digital loop controller of claim 9, further configured to adjust the one or more of the setpoint, the first digital value, and the second digital value to correct for an offset in the first digital value, wherein the offset in the first digital value corresponds to a constant offset in the output current.

12. The digital loop controller of claim 9, wherein to regulate the function of the output voltage and the output current, the digital loop controller is configured to:

adjust the output voltage to maintain the output voltage at the specified setpoint; and adjust the specified setpoint according to a function of the first digital value and a parameter that is proportional to a value of the specified resistor.

13. The digital loop controller of claim 9, wherein to regulate the function of the output voltage and the output current, the digital loop controller is configured to:

adjust the output voltage to maintain the output voltage at a specified setpoint; and adjust the second digital value according to a function of the first digital value and a parameter that is proportional to a value of the specified resistor.

14. The digital loop controller of claim 9, wherein to regulate the function of the output voltage and the output current, the digital loop controller is configured to:

adjust the output voltage to maintain the output current at the specified setpoint; and adjust the specified setpoint according to a function of the second digital value and a parameter that is inversely proportional to a value of the specified resistor.

15. The digital loop controller of claim 9, wherein to regulate the function of the output voltage and the output current, the digital loop controller is configured to:

adjust the output voltage to maintain the output current at a specified setpoint; and adjust the first digital value according to a function of the second digital value and a parameter that is inversely proportional to a value of the specified resistor.

16. The digital loop controller of claim 9, wherein to regulate the function of the output voltage and the output current, the digital loop controller is configured to:

generate a digital control value based on the first digital value, the second digital value, and a parameter that is proportional to a value of the specified resistor;

generate an analog control signal from the digital control value; and adjust the output voltage according to the analog control signal.

17. A method for testing a device using a source-measure unit (SMU), the method comprising:

providing a supply voltage across input terminals of the device to effect a supply current flowing in the device;

generating a first digital signal representative of the supply current;

generating a second digital signal representative of the supply voltage;

regulating one of the supply voltage and the supply current to remain at a specified setpoint value corresponding to the one of the supply voltage and the supply current, according to:

the first digital value;
the second digital value; and
a parameter that is proportional to a value of a specified resistance not physically coupled between the SMU and the device, to simulate effects of the specified resistance on a control path between the SMU and the device.

18. The method of claim 17, wherein said regulating comprises regulating the supply voltage to remain at the specified setpoint value corresponding to the supply voltage, comprising:

generating an error value by subtracting the second digital value and a multiple of the first digital value and the parameter, from the specified setpoint value corresponding to the supply voltage; and adjusting the supply voltage according to the error value.

19. The method of claim 18, wherein said adjusting the supply voltage comprises:

providing the error value to an integrator function; and
adjusting the supply voltage according to an output of the integrator function.

20. The method of claim 18, wherein said adjusting the supply current comprises:

providing the error value to an integrator function; and
adjusting the supply voltage according to an output of the integrator function.

21. The method of claim 17, wherein said regulating comprises regulating the supply current to remain at the specified setpoint value corresponding to the supply current, comprising:

generating an error value by subtracting the first digital value and a multiple of the second digital value and an inverse of the parameter, from the specified setpoint value corresponding to the supply current; and adjusting the supply current according to the error value.

22. The method of claim 17, wherein said regulating comprises:

regulating the supply voltage to remain at the specified setpoint value corresponding to the supply voltage, for a first range of values of the specified resistance; and regulating the supply current to remain at the specified setpoint value corresponding to the supply current for a second range of values of the specified resistance;

wherein the second range of values comprise greater values than the first range of values.

23. The method of claim 17, wherein said regulating is performed in hardware.

24. The method of claim 17, wherein the parameter is proportional to a negative value of the specified resistance.

* * * * *

UNITED STATES PATENT AND TRADEMARK OFFICE
CERTIFICATE OF CORRECTION

| | | |
|---|---|---|
| PATENT NO. | : 8,604,765 B2 | Page 1 of 1 |
| APPLICATION NO. | : 13/154282 | |
| DATED | : December 10, 2013 | |
| INVENTOR(S) | : Regier et al. | |

It is certified that error appears in the above-identified patent and that said Letters Patent is hereby corrected as shown below:

Title Page:

Item (74) *Attorney, Agent, or Firm*:
please delete "Myertons" and substitute -- Meyertons --.

Signed and Sealed this
Fourth Day of March, 2014

Michelle K. Lee
*Deputy Director of the United States Patent and Trademark Office*